(12) United States Patent
Maeda

(10) Patent No.: US 6,216,253 B1
(45) Date of Patent: *Apr. 10, 2001

(54) METHOD AND APPARATUS FOR VERIFYING AND ELECTRICAL CONFIGUARATION USING A PSUEDO-ELEMENT PATTERN

(75) Inventor: Koji Maeda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/789,490

(22) Filed: Jan. 27, 1997

(30) Foreign Application Priority Data

Jan. 27, 1996 (JP) .................................................. 8-013161

(51) Int. Cl.[7] ...................................................... G06F 17/50
(52) U.S. Cl. ...................................................... 716/5; 716/11
(58) Field of Search ................................... 364/488, 489, 364/490, 491, 578; 430/5; 716/5, 19, 11

(56) References Cited

U.S. PATENT DOCUMENTS

| | | | |
|---|---|---|---|
| 3,818,330 | * | 6/1974 | Hiroshima et al. ................... 324/549 |
| 4,939,681 | * | 7/1990 | Yokomizo et al. .................... 703/14 |
| 5,436,097 | * | 7/1995 | Norishima et al. ..................... 430/5 |
| 5,466,976 | * | 11/1995 | Ichihara ................................ 307/112 |
| 5,556,805 | * | 9/1996 | Tanizawa et al. .................... 438/637 |
| 5,608,241 | * | 3/1997 | Shibuya ................................. 257/207 |
| 5,610,832 | * | 3/1997 | Wikle et al. ............................ 716/11 |
| 5,759,914 | * | 6/1998 | Park ....................................... 438/624 |
| 5,763,143 | * | 6/1998 | Sakura ................................... 430/330 |

FOREIGN PATENT DOCUMENTS

| | | |
|---|---|---|
| 338852 | 2/1991 | (JP) . |
| 03152542 | 6/1991 | (JP) . |
| 04128974 | 4/1992 | (JP) . |

OTHER PUBLICATIONS

Heeb et al "Approximate Time–Domain Models of Three–Dimensional Interconnects," IEEE, pp. 201–205, Sep. 1990.*

Sakata, T. et al., "A Circuit Comparison System for Bipolar Linear LSI", in Proceedings of the Design Automation Conference (DAC), vol. Conf. 22, pp. 429–434, 1985.

Razdan, R., "HCNC: High Capacity Netlist Compare", in Proceedings of the Custom Integrated Circuits Conference, vol. Conf. 15, pp. 170601–170605, 1993.

European Search Report dated Mar. 17, 2000.

"Basic super LSI CAD"; pub. Dec. 25, 1983; pp. 1, 146–151.

* cited by examiner

Primary Examiner—Matthew Smith
Assistant Examiner—Vuthe Siek
(74) Attorney, Agent, or Firm—McGinn & Gibb, PLL

(57) ABSTRACT

To prevent a false error from occurring in the comparison and collation between circuit connection information and a mask pattern, a method and apparatus for verifying an electrical configuration include designing a mask pattern from a circuit diagram, extracting output terminals having equal potential from the mask pattern, and inserting at least one first pseudo-element pattern between the output terminals.

20 Claims, 4 Drawing Sheets

US 6,216,253 B1

METHOD AND APPARATUS FOR VERIFYING AND ELECTRICAL CONFIGUARATION USING A PSUEDO-ELEMENT PATTERN

The present application is a Continued Prosecution application (CPA) of U.S. patent application No. 08/789,490 filed on Jan. 27, 1997.

BACKGROUND OF THE INVENTION

The present invention generally relates to a method and apparatus for verifying an electrical configuration, and more particularly to a method and apparatus for judging whether output terminals of a mask pattern and a circuit diagram correspond.

DESCRIPTION OF THE RELATED ART

Integrated circuits are produced by using mask patterns of the integrated circuits, based on circuit diagrams. For generating the mask patterns, verification is required as to whether the circuit diagrams and the circuit connections of the mask patterns are equivalent to each other. For this verification, computers are employed (e.g., a Computer Aided Design (CAD) computer system).

FIG. 1 is a flowchart showing a conventional method of verifying the coincidence between the circuit diagram and the mask pattern. In describing the verification method of FIG. 1, FIGS. 2 and 3 are referred to for easy understanding of FIG. 1. FIG. 2 is an example of a circuit diagram containing a plurality of functional blocks (100-n (where n is a positive integer)). A functional block 100 has an input terminal 1, an inverter 2, a node 27, and output terminals 3, 4. A functional block 101 has an input terminal 1', a buffer 2', and an output terminal 3'. FIG. 3 is an example of a mask pattern based on node 27, and output terminals 3, 4 in FIG. 2 in which output terminals 9, 13 are connected by contacts 8, 11, respectively, by using a first metal wire 6.

Turning to the conventional method, first a circuit diagram such as that shown in FIG. 2 is generated (step S12). Next, a mask pattern such as that shown in FIG. 3 is designed based on the circuit diagram (step S13). In parallel with these procedures, output terminals (e.g., output terminals 3, 4, and 3') are extracted from the circuit diagram generated in step S12 (step S14). Next, output terminals judged to have an equal electric potential (e.g., terminals 3, 4 in FIG. 2) in step S14, are extracted (step S15).

Any one of the equal-potential output terminals is retained, but other terminals of the equal-potential output terminals are removed. This procedure is called "shrinkage". Therefore, either terminal 3 or terminal 4 is removed (step S16) since these terminals are equal potential output terminals. The shrinkage is needed so that the CAD device can recognize that every equal-potential output terminal is identical. For example, the CAD device cannot distinguish terminal 3 from terminal 4 because they have the same potential. Therefore, any one output terminal of the equal-potential output terminals is selected as a representative by the CAD device although there are many output terminals having equal-potential.

Next, circuit connection information (e.g., the information that output terminal 3' is connected to input terminal 1) is extracted from the circuit diagram (step S17).

In step S18, the information of the mask pattern designed in step S13 is compared and collated with the circuit connection information extracted in step S17. At this time, the mask pattern as shown in FIG. 3, has a plurality of equal-potential output terminals 9 (OUT 1) and 13 (OUT 2) which have a different terminal name (designation), whereas the circuit connection information has only either one of output terminal 3 (OUT 1) or output terminal 4 (OUT 2) of FIG. 2. Therefore, the CAD device detects an error (step S19).

When an error is detected in step S19, it is judged by the CAD device whether the error is a false error caused by a shrinkage in step S16 or whether the error is a true error of mismatch caused by design mistakes (step S20). If a true error (e.g., a "NO" in step S20) exists, the method returns to step S13, and the mask pattern is redesigned. If only a false error exists due to the shrinkage (e.g., a "YES" in step S20), the circuit diagram and the mask pattern are assumed to match, and the verification ends.

However, a problem arises in that, to judge the false error, the conventional method and CAD apparatus require many steps and much time. Thus, system efficiency is poor.

SUMMARY OF THE INVENTION

In view of the foregoing problems of the conventional method and apparatus, it is therefore an object of the present invention to provide an improved method for verifying an electrical configuration (e.g., an electrical circuit).

It is another object of the present invention to provide an improved apparatus for verifying an electrical configuration.

In a first aspect, an apparatus and method according to the present invention includes designing a mask pattern from a circuit diagram, extracting output terminals which have equal potential from the mask pattern, and inserting at least one first pseudo-element pattern between the output terminals.

With the unique and unobvious structure and method of the present invention, the CAD apparatus can recognize easily the difference between output terminals which have a same potential because a pseudo-element pattern is inserted between the output terminals. Therefore, the steps and time required for verifying the electrical configuration are decreased, as compared to the conventional method and apparatus.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 4:
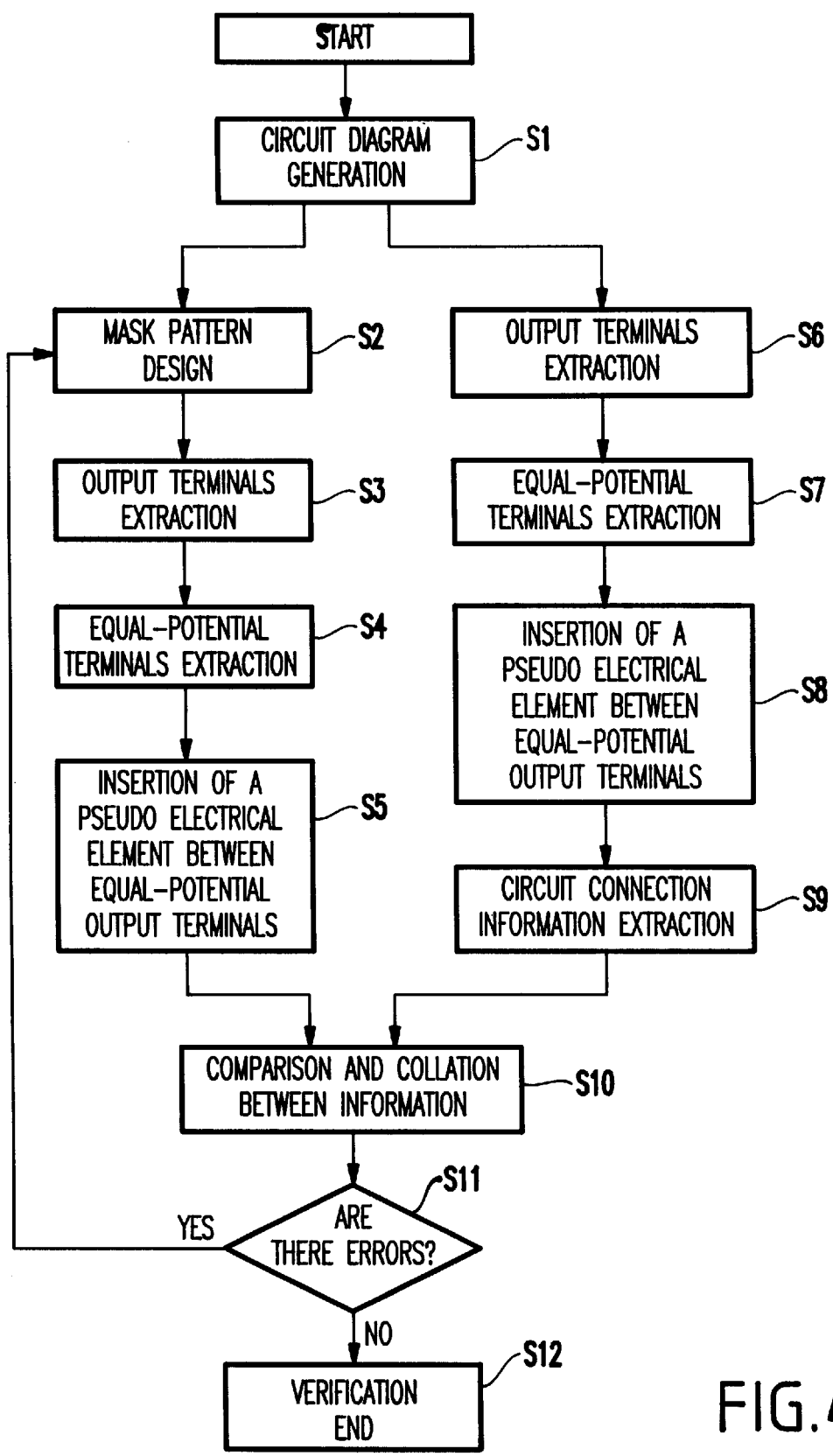
FIG. 4 is a flowchart of a method according to the present invention.

Referring now to the drawings, and more particularly to FIG. 4, there is a flowchart of a first embodiment of a method of verifying the correspondence between a circuit diagram and a mask pattern according to the present invention.

Figure 3:
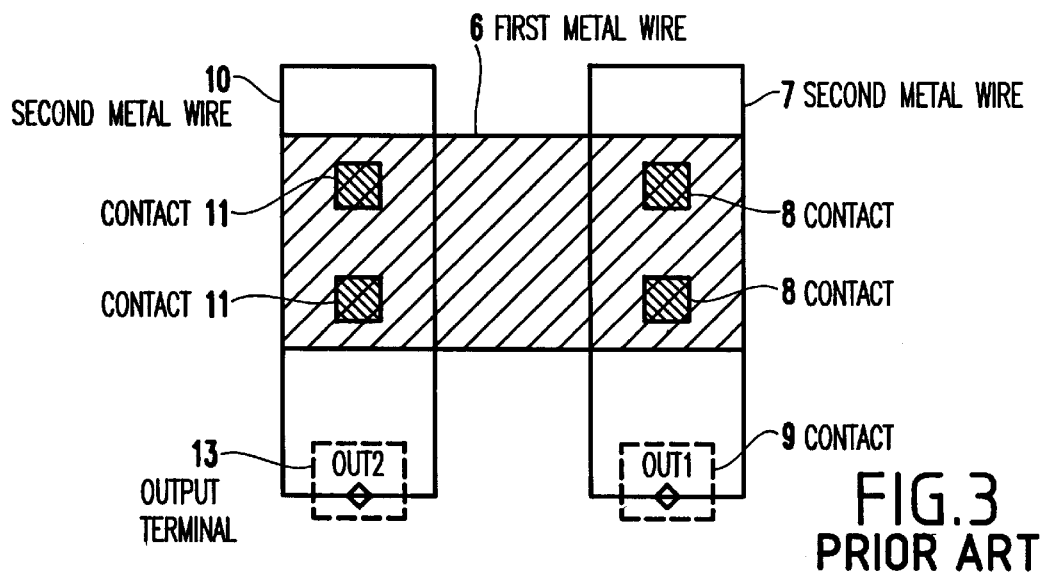
FIG. 3 is a mask pattern for output terminals 3, 4 and a node 27 of a functional block 100 in FIG. 2.

In the verification method of FIG. 4, first, the circuit diagram of an integrated circuit is generated similarly as in the conventional method (step S1). Then, a mask pattern such as that in FIG. 3 is designed based on the circuit diagram (step S2). Simultaneously, output terminals are extracted from the circuit diagram (step S6). Among the output terminals, the equal-potential terminals 3 and 4 are identified and extracted (step S7).

Figure 1:
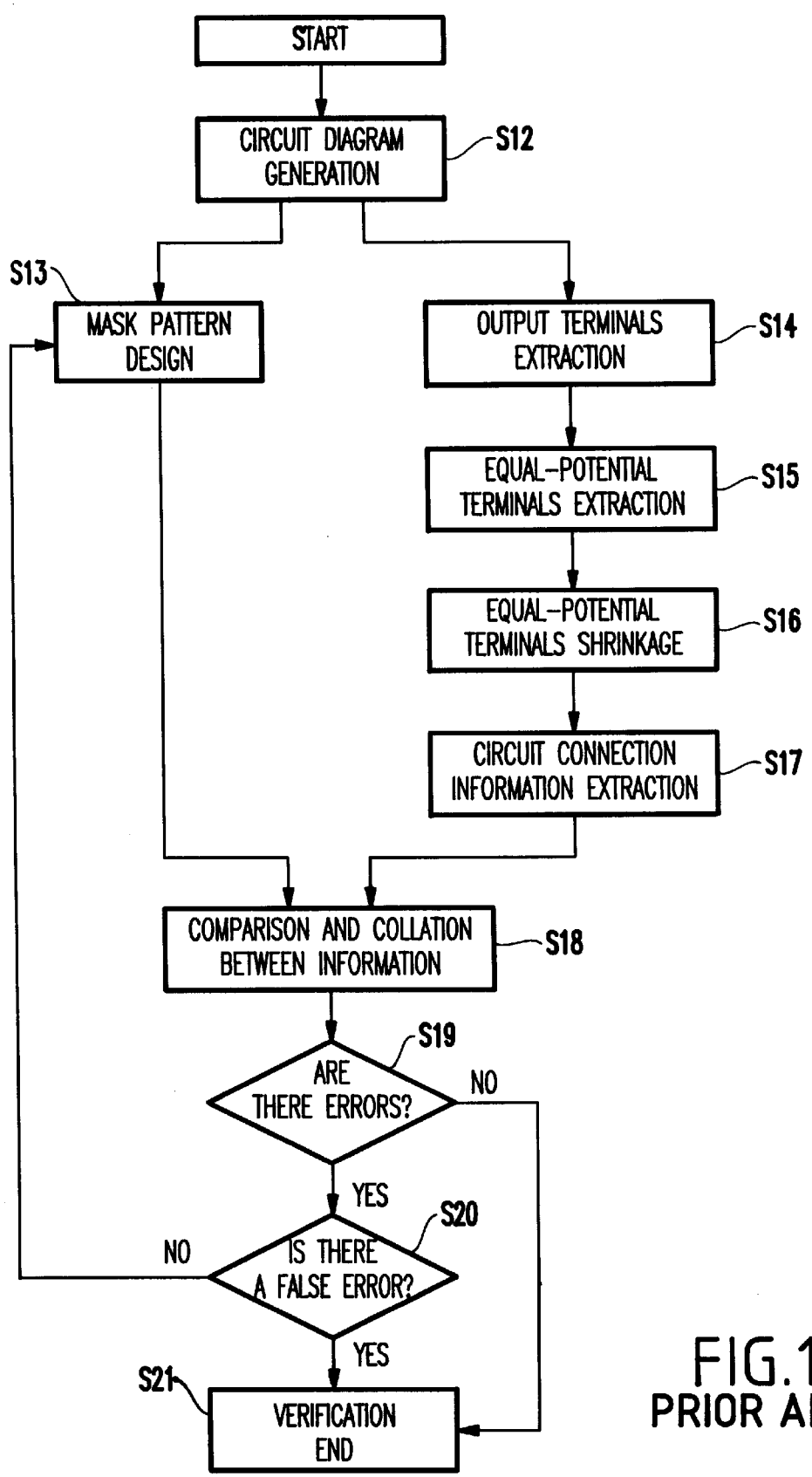
FIG. 1 is a flowchart showing a conventional method of verifying an electric configuration.
Figure 2:
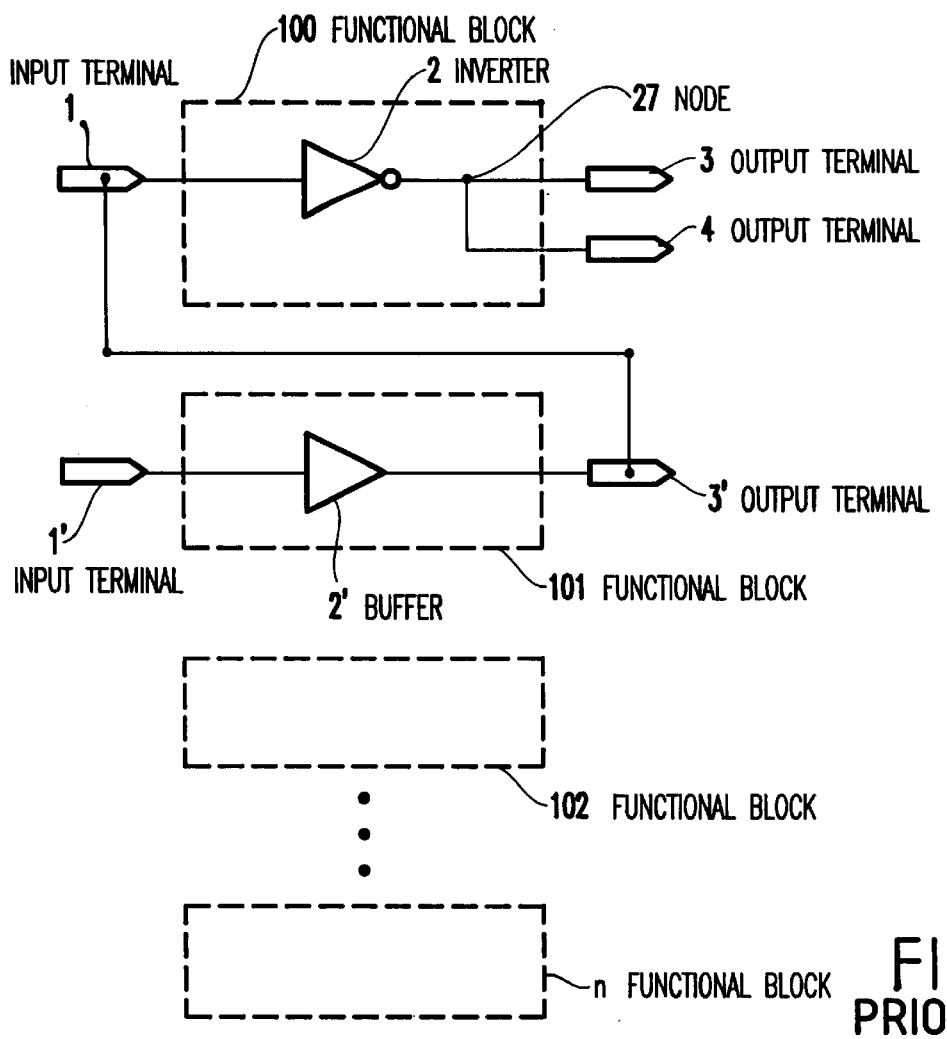
FIG. 2 is a circuit diagram containing a plurality of functional blocks.
Figure 5:
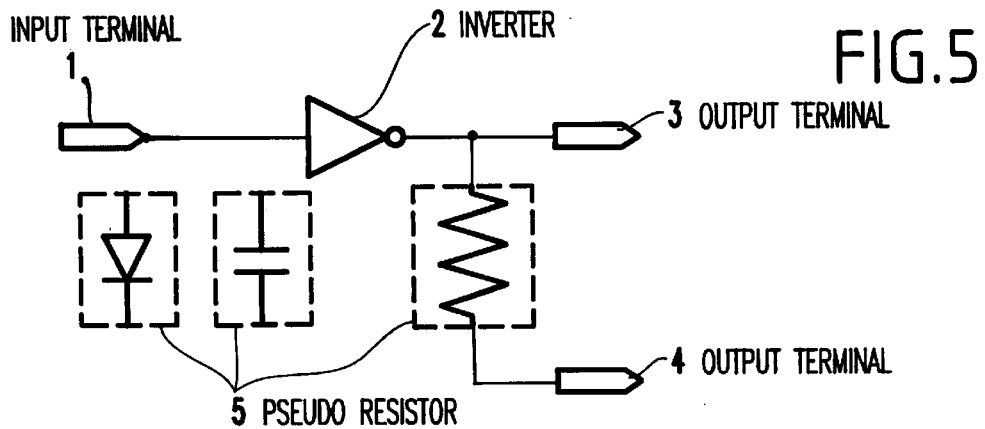
FIG. 5 is a circuit diagram showing a connection of a pseudo-element pattern (e.g., a dummy-element pattern)

As shown in FIG. 5, which illustrates a circuit diagram including circuit connection information, a pseudo-electrical component 5 (e.g., a resistance element 5, but which may be other pseudo-electrical elements such as a diode, a capacitor, or the like) is inserted between the output terminal 3 and the output terminal 4 which are the equal-potential terminals extracted in step S7 (step S8). It is noted that, while only one pseudo-electrical element is described as being inserted, more than one pseudo-element could be inserted if deemed advantageous by the designer. Thereafter, circuit connection information is extracted based on a modified (e.g., corrected) circuit diagram as shown in FIG. 5 (step S9). At this time, the CAD apparatus recognizes that the output terminal 3 and the output terminal 4 have different potentials because the pseudo-resistance element is inserted therebetween. Therefore, the shrinkage step S16 of the conventional method in FIG. 1 is not needed. In step S9, information of both output terminals 3 and 4 are extracted.

Similarly, output terminals are extracted also from the mask pattern (see FIG. 3) generated in step S2 (step S3). Furthermore, among the output terminals extracted, the output terminals 9 and 13 having equal-potential are extracted (step S4).

Next, a pseudo-resistance pattern (or other dummy pattern) 12 is inserted between the extracted equal-potential output terminals 9 and 13 (step S5). The operation of inserting the pseudo-resistance pattern 12 can be performed, for example, by inserting the pseudo-resistance pattern simultaneously with the input of the layout data for output terminals. Therefore, no additional time for designing mask patterns is needed. The pseudo-resistance pattern 12, as shown in FIG. 6, is inserted between a contact 11 and the output terminal 13 (OUT 2).

Figure 6:
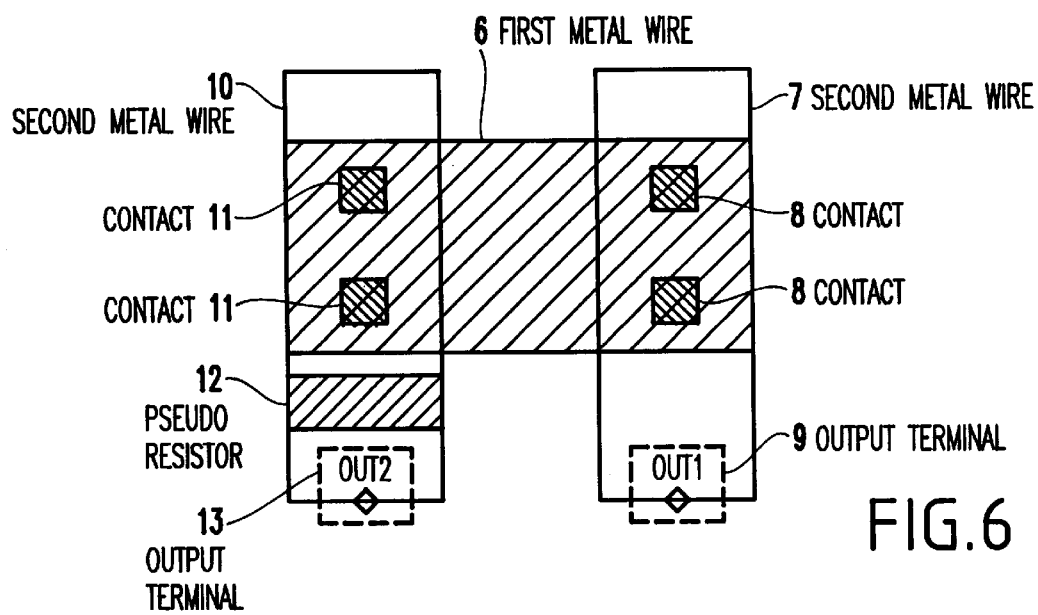
FIG. 6 is a mask pattern showing an exemplary layout of the pseudo-element pattern 12 of a first embodiment according to the present invention.

At this time, the electrical node of the portion beneath the pseudo-resistance pattern 12 of the region of the second metal wiring pattern 10 in FIG. 6 becomes the output terminal 13 (OUT 2). The electrical node of the region of the upper second metal wiring pattern 10 located above the pseudo-resistance pattern 12 in FIG. 6 becomes the output terminal 9 (OUT 1). Also, the electrical node of the second metal wiring pattern 7 and the first metal wiring pattern 6 become the output terminal 9 (OUT 1).

Thus, the conventional false error due to the shrinkage operation is removed, thereby making unnecessary the judgment of the false error which requires a large number of steps in the conventional method. In step S11, if errors are detected in the comparison and collation of step S10, then immediately the processing returns to step S2 and the mask pattern is redesigned. If no error is detected, verification ends (step S12).

Figure 7:
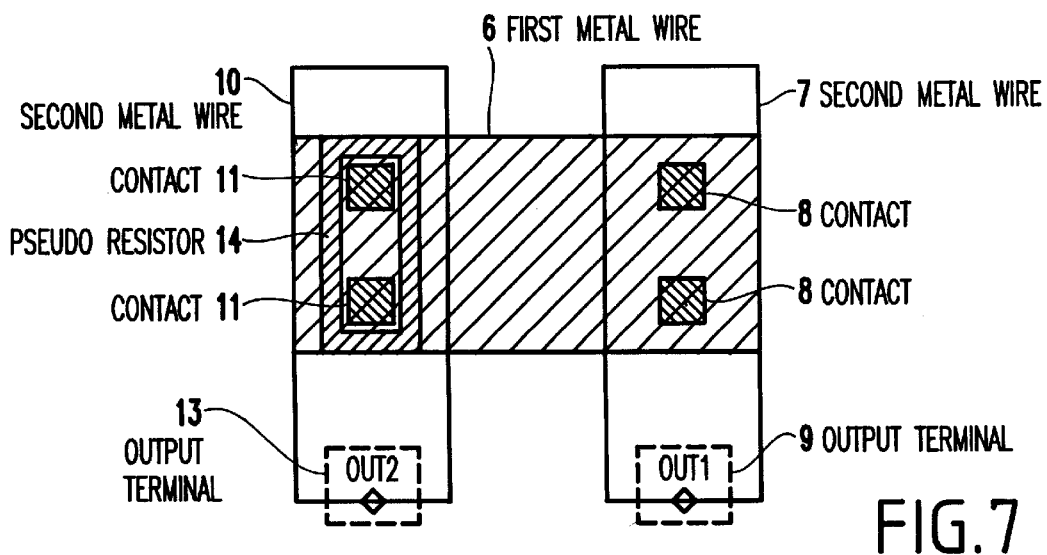
FIG. 7 is a mask pattern showing an exemplary layout of the pseudo-element pattern 14 of a second embodiment according to the present invention.

FIG. 7 is a diagram showing an exemplary layout of an electrical pseudo-element pattern 14 (e.g., a dummy pseudo-resistance pattern 14) according to a second embodiment of the present invention.

In FIG. 7, the pseudo-resistance pattern 14 is inserted so as to surround contacts 11 which connect a first metal wiring pattern 6 and a second metal wiring pattern 10. Therefore, the electrical node of the outer region of the pseudo-resistance pattern 14 on the second metal wiring pattern 10 of FIG. 7 becomes the output terminal 13 (OUT 2). The electrical node of the inner region of the pseudo resistance pattern 14 on the second metal wiring pattern 10, the second metal wiring pattern 7, and the first metal wiring pattern 6 becomes the output terminal 9 (OUT 1).

In the second embodiment, wires can be advantageously extended from the region of the node OUT 2 in both upper and lower directions of FIG. 7 without danger of short-circuiting. Further, the pseudo-element pattern becomes thin. Therefore, the degree of freedom of wiring between functional blocks becomes higher, and the integration density of the integrated circuits can be increased.

As mentioned above, the pseudo-element pattern may be element patterns other than resistance elements, such as capacitors, diodes or the like, for the purpose of discriminating a plurality of equal-potential terminals.

The pseudo-element pattern is removed after verification. Therefore, the resulting products made using the mask pattern has no pseudo-element pattern between output terminals having equal potential.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A method of verifying an electrical configuration comprising:

designing a mask pattern from a circuit diagram;

extracting output terminals having equal potential and a conductive line connected to said output terminals from the mask pattern;

inserting at least one first pseudo-element pattern on said conductive line between the output terminals extracted from said mask pattern;

extracting output terminals having equal potential from the circuit diagram;

inserting at least one second pseudo-element pattern between the output terminals extracted from the circuit diagram; and judging whether the output terminals extracted from the mask pattern correspond to the output terminals extracted from the circuit diagram.

2. A method as recited in claim 1, wherein each of the first and second pseudo-element patterns comprises at least one of a resistance pattern, a capacitor and a diode.

3. The method, as claimed in claim 1, wherein said inserting comprises inserting said pseudo-element between different terminals supplied with the same voltage potential.

4. The method, as claimed in claim 1, further comprising:

comparing and collating information from said circuit diagram with that of said mask pattern of said circuit diagram such that false errors caused by shrinkage are eliminated.

5. A method of verifying an electrical configuration comprising;

designing a circuit diagram;

extracting output terminals having equal potential and a conductive line connected to said output terminals from the circuit diagram;

inserting at least one first pseudo-element pattern on said conductive line between the output terminals extracted from said circuit diagram;

designing a mask pattern from the circuit diagram;

extracting output terminals having equal potential from the mask pattern;

inserting at least one second pseudo-element pattern between the output terminals extracted from the mask pattern; and judging whether the output terminals extracted from the mask pattern correspond to the output terminals extracted from the circuit diagram.

6. A method as recited in claim 5, wherein each of the first and second pseudo element patterns comprises at least one of a resistance pattern, a capacitor and a diode.

7. The method, as claimed in claim 5, wherein said inserting comprises inserting said pseudo-element between different terminals supplied with the same voltage potential.

8. The method, as claimed in claim 5, further comprising:

comparing and collating information from said circuit diagram with that of said mask pattern of said circuit diagram such that false errors caused by shrinkage are eliminated.

9. An apparatus for verifying an electrical configuration comprising:

means for designing a mask pattern from a circuit diagram;

means for extracting output terminals having equal potential and a conductive line connected to said output terminals from the mask pattern;

means for inserting at least one first pseudo-element pattern on said conductive line between the output terminals extracted from said mask pattern;

means for extracting output terminals having equal potential from the circuit diagram;

means for inserting at least one second pseudo-element pattern between the output terminals extracted from the circuit diagram; and means for judging whether the output terminals extracted from the mask pattern correspond to the output terminals extracted from the circuit diagram.

10. An apparatus as recited in claim 9, wherein each of the first and second pseudo element patterns comprises at least one of a resistance pattern, a capacitor and a diode.

11. The apparatus, as claimed in claim 9, wherein said means for inserting comprises means for inserting said pseudo-element between different terminals supplied with the same voltage potential.

12. The apparatus, as claimed in claim 9, further comprising:

means for comparing and collating information from said circuit diagram with that of said mask pattern of said circuit diagram such that false errors caused by shrinkage are eliminated.

13. An apparatus for verifying an electrical configuration comprising:

means for designing a circuit diagram;

means for extracting output terminals having equal potential and a conductive line connected to said output terminals from the circuit diagram;

means for inserting at least one first pseudo-element pattern on said conductive line between the output terminals extracted from said circuit diagram;

means for designing a mask pattern from the circuit diagram;

means for extracting output terminals having equal potential from the mask pattern;

means for inserting at least one second pseudo-element pattern between the output terminals extracted from the mask pattern; and means for judging whether the output terminals extracted from the mask pattern correspond to the output terminals extracted from the circuit diagram.

14. An apparatus as recited in claim 13, wherein each of the first and second pseudo element patterns comprises at least one of a resistance pattern, a capacitor and a diode.

15. The apparatus, as claimed in claim 13, wherein said means for inserting comprises means for inserting said pseudo-element between different terminals supplied with the same voltage potential.

16. The apparatus, as claimed in claim 13, further comprising:

means for comparing and collating information from said circuit diagram with that of said mask pattern of said circuit diagram such that false errors caused by shrinkage are eliminated.

17. A semiconductor element formed by a process comprising:

designing a mask pattern from a circuit diagram;

extracting output terminals having equal potential and a conductive line connected to said output terminals from the mask pattern;

inserting at least one first pseudo-element pattern on said conductive line between the output terminals extracted from said mask pattern for verification;

removing said at least one first pseudo-element pattern after verification is completed;

extracting output terminals having equal potential from the circuit diagram;

inserting at least one second pseudo-element pattern between the output terminals for verification; and removing said at least one second pseudo-element pattern after verification is completed.

18. A semiconductor element as recited in claim 17, wherein said inserting the at least one first pseudo-element pattern and said inserting the at least one second pseudo-element pattern comprise inserting a first resistance pattern and inserting a second resistance pattern, respectively.

19. The semiconductor element formed by the process, as claimed in claim 17, wherein said inserting comprises inserting said pseudo-element between different terminals supplied with the same voltage potential.

20. The semiconductor element formed by the process, as claimed in claim 17, further comprising:

comparing and collating information from said circuit diagram with that of said mask pattern of said circuit diagram such that false errors caused by shrinkage are eliminated.

* * * * *